(12) United States Patent
Liu

(10) Patent No.: US 8,077,472 B2
(45) Date of Patent: Dec. 13, 2011

(54) PRINTED CIRCUIT BOARD WITH TIN PADS

(75) Inventor: Shu-Tzu Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 667 days.

(21) Appl. No.: 12/211,035

(22) Filed: Sep. 15, 2008

(65) Prior Publication Data
US 2009/0301768 A1    Dec. 10, 2009

(30) Foreign Application Priority Data

Jun. 5, 2008   (CN) .......................... 2008 1 0302038

(51) Int. Cl.
*H05K 5/00* (2006.01)
*H05K 1/09* (2006.01)
(52) U.S. Cl. ......... 361/753; 174/257; 174/263; 174/266
(58) Field of Classification Search .......... 174/250–268; 361/748–803
See application file for complete search history.

(56) References Cited

U.S. PATENT DOCUMENTS

| | | | | |
|---|---|---|---|---|
| 4,851,614 A | * | 7/1989 | Duncan, Jr. .................... | 174/263 |
| 5,326,937 A | * | 7/1994 | Watanabe ....................... | 174/263 |
| 5,414,223 A | * | 5/1995 | Suski et al. .................... | 174/262 |
| 5,420,378 A | * | 5/1995 | Estes et al. ..................... | 174/263 |
| 5,545,223 A | * | 8/1996 | Neuenfeldt et al. .......... | 435/325 |
| 5,668,699 A | * | 9/1997 | Bell et al. ....................... | 361/753 |
| 6,295,210 B1 | * | 9/2001 | Lanzone et al. .............. | 361/799 |
| 7,898,820 B2 | * | 3/2011 | Kao et al. ....................... | 361/807 |
| 2009/0200074 A1 | * | 8/2009 | Douriet et al. ................ | 174/265 |

FOREIGN PATENT DOCUMENTS

| | | |
|---|---|---|
| CN | 1155369 A | 7/1997 |
| CN | 201197221 Y | 2/2009 |
| JP | 2000-4088 A | 1/2000 |

* cited by examiner

*Primary Examiner* — Zachary M Pape
(74) *Attorney, Agent, or Firm* — Altis Law Group, Inc.

(57) ABSTRACT

A printed circuit board of the present disclosure includes a main body, a tin layer, and a solder mask. The main body defines a through hole configured for being connected to a grounding component. The tin layer is formed on a surface of the main body around the through hole. The tin layer contacts the grounding component. The solder mask is formed between a periphery of the through hole and the tin layer. The solder mask is configured to prevent tin cream of the tin layer from flowing into the through hole.

8 Claims, 5 Drawing Sheets

PRINTED CIRCUIT BOARD WITH TIN PADS

BACKGROUND

1. Technical Field

The present disclosure relates to printed circuit boards, more particularly to a printed circuit board that can reduce electromagnetic interference.

2. Discussion of the Related Art

Printed circuit boards (PCBs) are widely used in electronic devices. When a PCB is used, electronic components of the PCB interfere with each other, thereby producing an interfering current called electromagnetic interference (EMI).

In order to prevent EMI, the interfering current needs to be electrically connected with a ground. A fixing member is passed through a through hole of the printed circuit board and engages with a housing that electrically connects with the ground. The printed circuit board includes a copper layer on a periphery of the through hole. A head portion of the fixing member contacts the copper layer. As such, the interfering current of the printed circuit board can be connected with the ground. However, the copper layer is easily oxidated. Thus, the copper layer needs to be coated by tin cream to prevent oxidation. In order to make the tin cream attach to the copper layer, the printed circuit board may be heated in an oven. In the oven, the tin cream is easily flowed into the through hole and fills the through hole. In order to prevent the tin cream from flowing in the through hole, the through hole is generally covered by adhesive tapes before the printed circuit board is placed into the oven.

However, it is very waste of time to mask the adhesive tapes, thereby causing high production costs.

Therefore, a new printed circuit board amending the aforementioned difficulties is desired.

SUMMARY

A printed circuit board of the present disclosure includes a main body, a tin layer, and a solder mask. The main body defines a through hole. The printed circuit board is connected to a grounding component via the through hole. The tin layer is formed on a surface of the main body around the through hole. The tin layer contacts the grounding component. The printed circuit board is electrically connected with a ground. The solder mask is formed between a periphery of the through hole and the tin layer. The solder mask is configured to prevent tin cream of the tin layer from flowing into the through hole.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present printed circuit board. Moreover, in the drawings, like reference numerals designate corresponding parts throughout the several views.

DETAILED DESCRIPTION

Figure 1:
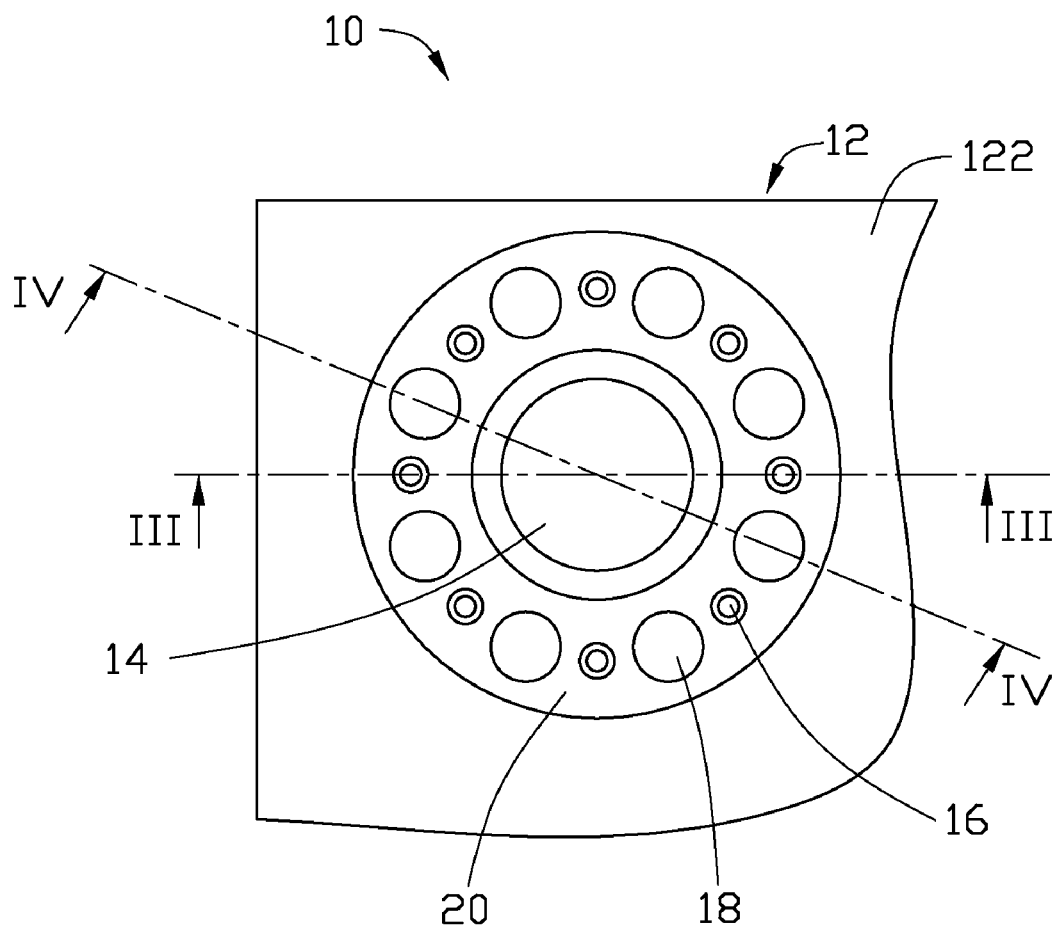
FIG. 1 is a partial top view of a printed circuit board in accordance with one embodiment of the present disclosure.
Figure 2:
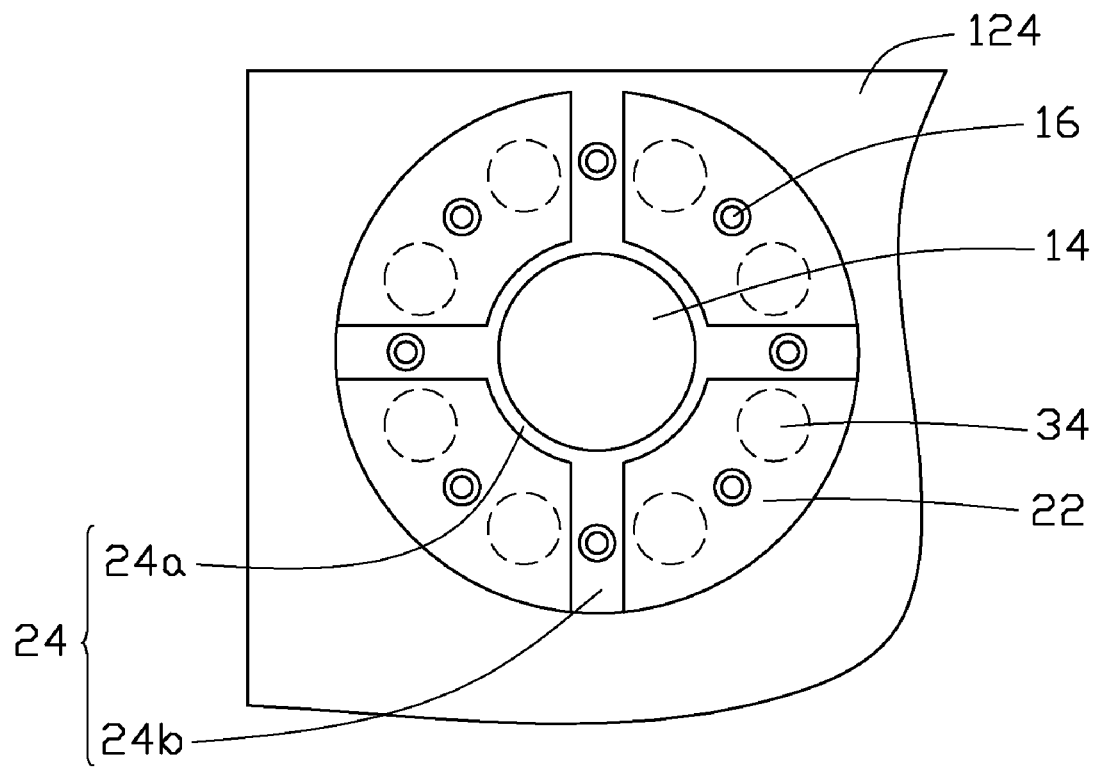
FIG. 2 is a partial bottom view of the printed circuit board in FIG. 1.

Referring to FIGS. 1 and 2, one embodiment of a printed circuit board 10 of the present disclosure includes a main body 12. The main body 12 defines a through hole 14 and a plurality of conductive vias 16. The conductive vias 16 are defined around a periphery of the through hole 14, and are arranged in a ring and substantially evenly spaced apart in one embodiment. The through hole 14 is configured for connecting to a grounding component, so that the printed circuit board 10 is grounded. In this embodiment, the through hole 14 is circular. The through hole 14 may be quadrate or other shapes in other embodiments.

The main body 12 includes a first surface 122 and a second surface 124 opposite to the first surface 122. A plurality of first tin pads 18 and a first copper layer 20 are formed on the first surface 122. The first tin pads 18 are substantially evenly arranged around the periphery of the through hole 14. The first tin pads 18 and the conductive vias 16 are positioned in an alternating manner on/in the periphery of the through hole 14.

A tin layer 22 and a solder mask 24 are formed on the second surface 124 of the main body around the through hole 14. A first portion 24a of the solder mask 24 is formed between a periphery of the through hole 14 and the tin layer 22. The tin layer 22 includes four semicircular-shaped portions substantially evenly arranged around the through hole 14. A second portion 24b of the solder mask 24 is formed between adjacent fan-shaped portions. In one embodiment, a color of the solder mask 24 may be green which is beneficial to one's eyes. Depending on the embodiment, the color of the solder mask 24 may be yellow, white, black, or other colors.

When the printed circuit board 10 is heated in an oven, the solder mask 24 prevents the tin cream of the tin layer 22 from flowing into the through hole 14. Alternatively, the tin layer 22 may include two, three, or more than four portions. The second portion 24b of the solder mask 24 is formed between adjacent portions of the tin layer 22. In alternative embodiments, the tin layer 22 may be ring-shaped. In such cases, the second portion 24b of the solder mask 24 may be omitted.

Figure 3:
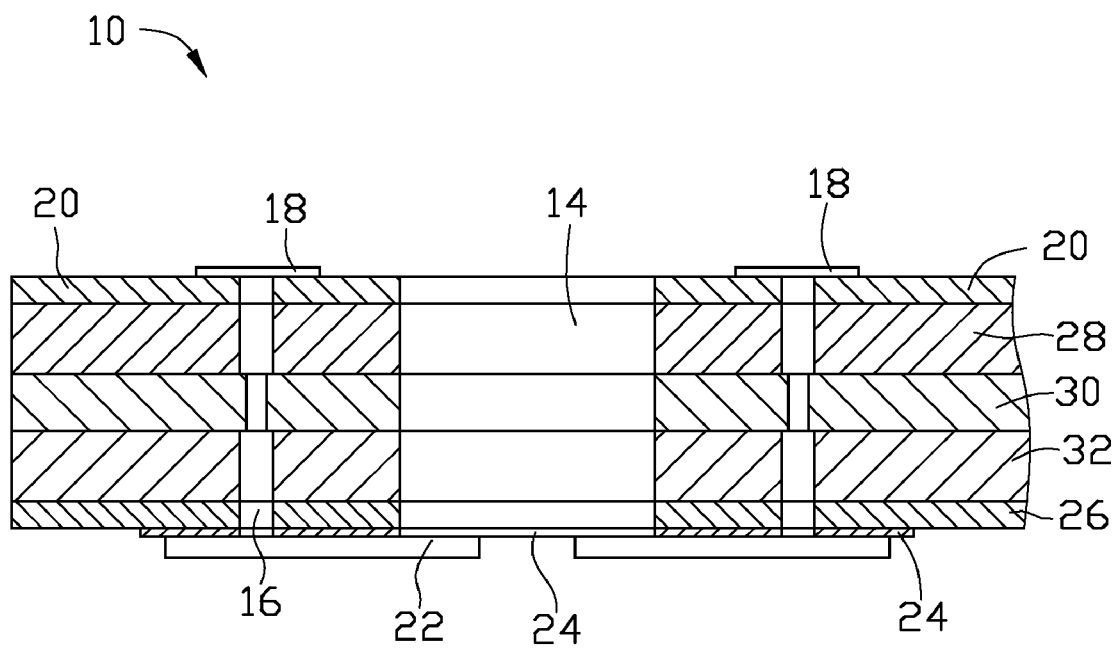
FIG. 3 is a partial cross-sectional view of the printed circuit board in FIG. 1, taken along the line III-III of FIG. 1.
Figure 4:
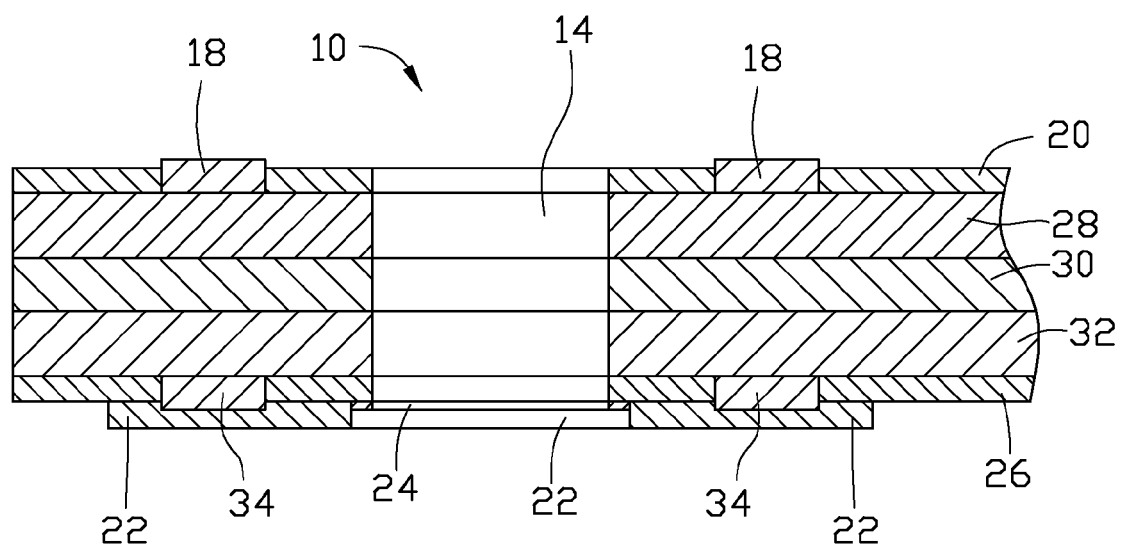
FIG. 4 is a partial cross-sectional view of the printed circuit board in FIG. 1, taken along the line IV-IV of FIG. 1.

Referring also to FIGS. 3 and 4, the main body 12 includes the first copper layer 20, a first steel layer 28, a grounding layer 30, a second steel layer 32, and a second copper layer 26, arranged in that order. A plurality of pads (not shown) with a conductive material are formed in the conductive vias 16. The plurality of pads provide an electrical connection between the first copper layer 20, the second copper layer 26 and the other layers. The tin layer 22 and the solder mask 24 are coated on the second copper layer 26.

The first tin pads 18 are positioned on the first steel layer 28, and protrude out of the first copper layer 20. The first tin pads 18 are electrically connected to the first steel layer 28. The grounding layer 30 is grounded. A plurality of second tin pads 34 are positioned on the second steel layer 32, and protrude out of the second copper layer 26. The second tin pads 34 are electrically connected to the second steel layer 32, and are evenly arranged on the periphery of the through hole 14. The tin layer 22 covers the second tin pads 34. Alternatively, the number of layers of the main body 12 may vary.

Figure 5:
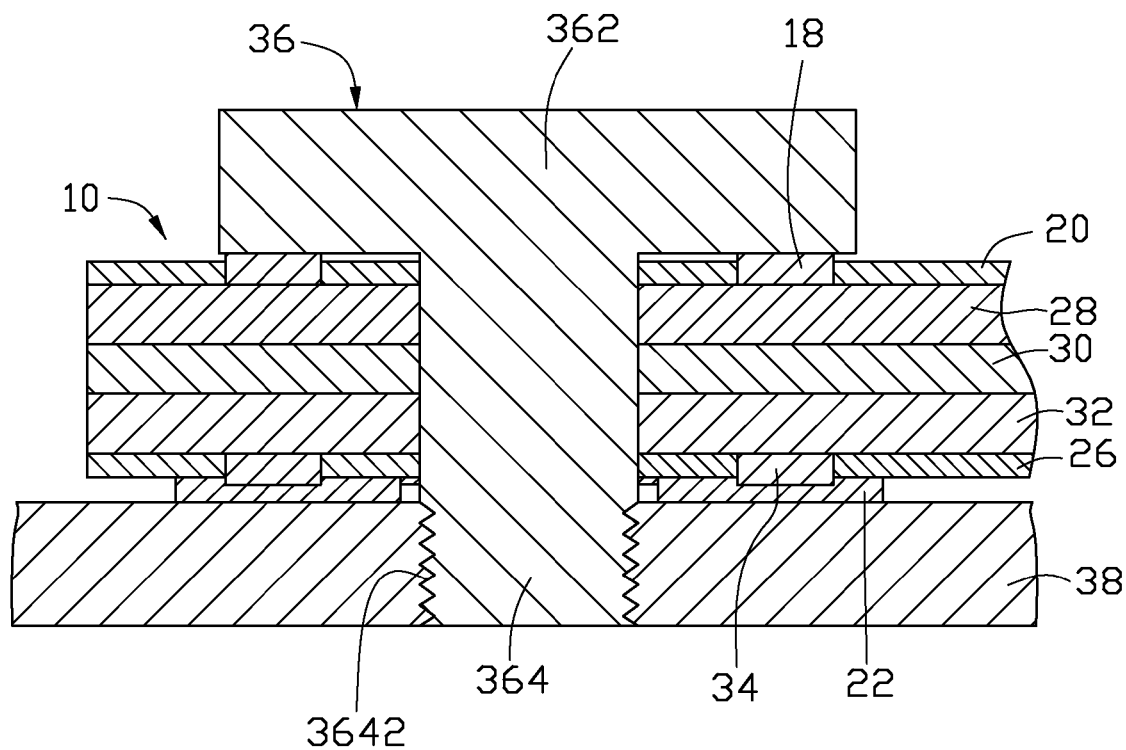
FIG. 5 is a partial cross-sectional view of the printed circuit board in FIG. 1, showing the printed circuit board connected to a housing of an electronic device.

Referring to FIG. 5, one embodiment of a method for reducing electromagnetic interference of the printed circuit board 10 will now be described. The printed circuit board 10 may be employed in an electronic device, such as a liquid crystal display monitor and a personal digital assistant, for example. The electronic device includes a fixing member 36 and a housing 38. The housing 38 is the grounding component. The fixing member 36 is a bolt, and includes a head portion 362 and a rod portion 364 extending from the head portion 362. An outer screw thread 3642 is formed on an end of the rod portion 364 away from the head portion 362. In assembly, the fixing member 36 is passed through the through hole 14 of the printed circuit board 10, then engages with the housing 38 of the electronic device. The head portion 362 of the fixing member 36 abuts the first tin pads 18, and the tin layer 22 of the printed circuit board 10 abuts the housing 38. The tin layer 22 conducts electricity very well because the four fan-shaped portions of the tin layer 22 are substantially evenly arranged.

The interfering current of the printed circuit board 10, which causes electromagnetic interference, can be connected with the ground via several paths. One such path, for example, begins from the head portion 362 of the fixing member 36 to the first tin pads 18, the first steel layer 28, the rod portion 364 of the fixing member 36, the grounding layer 30, and the ground. This path has the lowest impedance. The interfering current is preferably grounded via this path. Another path begins from the head portion 362 of the fixing member 36 to the first tin pads 18, the first steel layer 28, the rod portion 364 of the fixing member 36, the housing 38, and ground.

It should be understood that, the first copper layer 20 and the second copper layer 26 are electrically connected with the first steel layer 28, the grounding layer 30, and the second steel layer 32 of the printed circuit board 10 via the pads in the conductive vias 16, so that each layer of the printed circuit board 10 is electrically connected with the fixing member 36. The tin layer 22 of the printed circuit board 10 is electrically connected with the housing 38 of the electronic device. Thus, the paths of the electrical current are not limited to the two paths described above. A plurality of paths are built between the printed circuit board 10 and ground. As such, the interfering current that causes electromagnetic interference is grounded, thereby reducing the electromagnetic interference.

In this embodiment, the first portion 24a of the solder mask 24 is formed between the periphery of the through hole 14 and the tin layer 22, and the second portion 24b of the solder mask 24 is formed between adjacent fan-shaped portions of the tin layer 22. Before the printed circuit board 10 is heated in the oven, the through hole 14 need not be covered by adhesive tapes. The solder mask 24 can prevent the tin layer 22 from inadvertently flowing/seeping into the through hole 14. In addition, coating the solder mask 24 on the second copper layer 26 can save a lot of time when compared to masking the adhesive tapes.

It is believed that the present embodiments and their advantages will be understood from the foregoing description, and it will be apparent that various changes may be made thereto without departing from the spirit and scope of the present disclosure or sacrificing all of its material advantages, the examples hereinbefore described merely being preferred or exemplary embodiments of the present disclosure.

What is claimed is:

1. A printed circuit board, comprising:
    a main body defining a through hole configured for being connected to a grounding component, wherein a fixing member is passed through the through hole of the printed circuit board, and engages with the grounding component, the main body includes a first copper layer, a first steel layer, a grounding layer, a second steel layer, and a second copper layer, arranged in that order, a plurality of first tin pads are positioned on the first steel layer, and protrude out of the first copper layer, a head portion of the fixing member abuts the first tin pads, the fixing member is electrically connected with the grounding layer, and a plurality of second tin pads are positioned on the second steel layer, and protrude out of the second copper layer;
    a tin layer formed on a surface of the main body around the through hole for contacting the grounding component, wherein the tin layer covers the second tin pads; and
    a solder mask formed between a periphery of the through hole and the tin layer, wherein the solder mask prevents tin cream of the tin layer from flowing into the through hole.

2. The printed circuit board as claimed in claim 1, wherein the tin layer comprises four fan-shaped portions substantially evenly arranged around the through hole, wherein the solder mask is formed between adjacent fan-shaped portions of the tin layer.

3. The printed circuit board as claimed in claim 1, wherein the tin layer and the solder mask are coated on the second copper layer.

4. The printed circuit board as claimed in claim 1, wherein the main body defines a plurality of conductive vias for providing an electrical connection between the first copper layer, the second copper layer and the first steel layer, the grounding layer, the second steel layer.

5. A printed circuit board, comprising:
    a main body defining a through hole configured for being connected to a grounding component, wherein a fixing member is passed through the through hole of the printed circuit board, and engages with the grounding component, the main body includes a first copper layer, a first steel layer, a grounding layer, a second steel layer, and a second copper layer, arranged in that order, a plurality of first tin pads are positioned on the first steel layer, and protrude out of the first copper layer, a head portion of the fixing member abuts the first tin pads, the fixing member is electrically connected with the grounding layer, and a plurality of second tin pads are positioned on the second steel layer, and protrude out of the second copper layer;
    a tin layer formed on a surface of the main body around the through hole, the tin layer comprising a plurality of portions and contacting the grounding component, wherein the tin layer covers the second tin pads; and
    a solder mask configured for preventing tin cream of the tin layer from flowing into the through hole, wherein a first portion of the solder mask is formed between a periphery of the through hole and the tin layer, and a second portion of the solder mask is formed between adjacent portions of the tin layer.

6. The printed circuit board as claimed in claim 5, wherein the tin layer and the solder mask are coated on the second copper layer.

7. The printed circuit board as claimed in claim 5, wherein the main body defines a plurality of conductive vias for providing an electrical connection between the first copper layer, the second copper layer and the first steel layer, the grounding layer, the second steel layer.

8. A printed circuit board, comprising:
    a main body defining a through hole configured for being connected to a grounding component, wherein a fixing member is passed through the through hole of the printed circuit board and engages with the grounding component, wherein the main body includes a first copper layer, a first steel layer, a grounding layer, a second steel layer, and a second copper layer, arranged in that order, a plurality of first tin pads are positioned on the first steel layer, and protrude out of the first copper layer, a plurality of second tin pads are positioned on the second steel layer, and protrude out of the second copper layer;

a tin layer formed on a surface of the main body around the through hole for contacting the grounding component, wherein the tin layer covers the second tin pads; and a solder mask formed between a periphery of the through hole and the tin layer, wherein the solder mask prevents tin cream of the tin layer from flowing into the through hole.

* * * * *